(12) United States Patent
Hanna et al.

(10) Patent No.: US 12,041,801 B2
(45) Date of Patent: Jul. 16, 2024

(54) LIQUID ORGANIC SEMICONDUCTOR MATERIAL

(71) Applicant: Japan Science and Technology Agency, Saitama (JP)

(72) Inventors: Jun-Ichi Hanna, Tokyo (JP); Keiji Tokunaga, Chiba (JP); Hiroaki Iino, Kanagawa (JP)

(73) Assignee: Japan Science and Technology Agency, Saitama (JP)

( * ) Notice: Subject to any disclaimer, the term of this patent is extended or adjusted under 35 U.S.C. 154(b) by 613 days.

(21) Appl. No.: 17/135,694

(22) Filed: Dec. 28, 2020

(65) Prior Publication Data

US 2021/0119165 A1    Apr. 22, 2021

Related U.S. Application Data

(60) Continuation of application No. 16/155,444, filed on Oct. 9, 2018, now abandoned, which is a division of application No. 13/496,451, filed as application No. PCT/JP2010/066475 on Sep. 15, 2010, now abandoned.

(30) Foreign Application Priority Data

Sep. 16, 2009   (JP) .................................. 2009-214717

(51) Int. Cl.
| | |
|---|---|
| H01L 51/50 | (2006.01) |
| H10K 30/00 | (2023.01) |
| H10K 50/11 | (2023.01) |
| H10K 50/14 | (2023.01) |
| H10K 85/60 | (2023.01) |

(52) U.S. Cl.
CPC ............. *H10K 50/11* (2023.02); *H10K 30/00* (2023.02); *H10K 50/14* (2023.02); *H10K 85/615* (2023.02); *Y02E 10/549* (2013.01)

(58) Field of Classification Search
CPC .......................... H10K 85/731; H10K 71/311
See application file for complete search history.

(56) References Cited

U.S. PATENT DOCUMENTS

| | | | | |
|---|---|---|---|---|
| 2004/0245497 A1* | 12/2004 | Hanna | .................. | H10K 85/731 |
| | | | | 252/299.01 |
| 2005/0224755 A1* | 10/2005 | Hanna | .................... | C09K 19/52 |
| | | | | 252/299.5 |

OTHER PUBLICATIONS

Lino Electronic and ionic Transports for Negative Charge Carriers in Smectic Liquid Crystalline Photoconductor J.Phys. Chem. B., 2005, 109, pp. 22120-22125 (Year: 2005).*

* cited by examiner

*Primary Examiner* — Anthony Ho
(74) *Attorney, Agent, or Firm* — Osha Bergman Watanabe & Burton LLP

(57) ABSTRACT

An organic material having at least one aromatic conjugated π-electron system is selected. The purity of the organic material is improved by purification, and a conduction mechanism of the organic material is confirmed by a time-of-flight method, whereby a liquid phase of the organic material is usable as an organic semiconductor. A method that enables the usage of a liquid phase of an organic material as an organic semiconductor is provided. The method involves confirming the electronic conduction of the organic material having at least one aromatic conjugated π-electron system by evaluation of a charge transport property using a time-of-flight method, and by evaluation of a dilution effect caused by addition of a diluent.

13 Claims, 9 Drawing Sheets

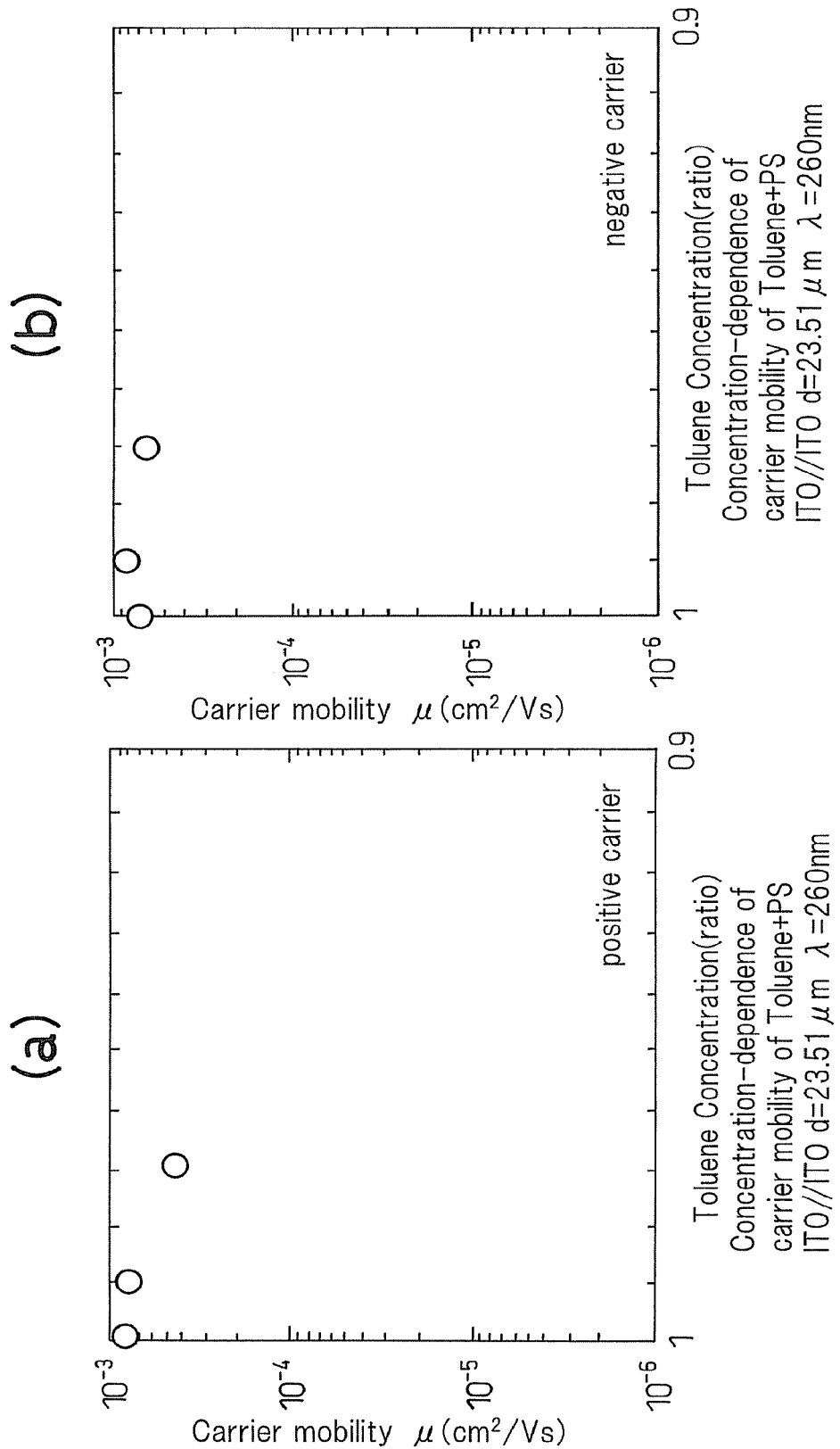

LIQUID ORGANIC SEMICONDUCTOR MATERIAL

TECHNICAL FIELD

The present invention relates to an organic material capable of exhibiting electronic conduction. The liquid organic semiconductor material according to the present invention can be applied to various wide fields, and can achieve a new process for producing an organic electronic device, or a new form thereof. Specific examples of such an organic electronic device may include: optical sensor, organic EL (electro-luminescence) device, organic transistor, organic solar cell, or organic semiconductor memory.

BACKGROUND ART

An organic semiconductor material is a material which can be used for an optical sensor, an organic photoreceptor, an organic EL element, an organic transistor, an organic solar cell, an organic semiconductor memory, and the like. Specific examples of the organic semiconductor material which have heretofore been used may include: for example, an amorphous thin film or polycrystalline thin film which has been formed on a by using vacuum deposition of an organic semiconductor substance, or by applying a solution containing an organic semiconductor substance onto a substrate. The organic semiconductor material may be, for example, a thin film material formed by dispersing the organic semiconductor substance into a polymer material or the like and applying the dispersed semiconductor substance onto a substrate; or a single-crystal material of the organic semiconductor material (that is, a semiconductor material which is a solid in a temperature range wherein a device using the semiconductor material can be driven). This is because, in order to produce an organic electronic device, the function of such a device should be achieved by utilizing the electronic conductivity exhibited by the organic semiconductor. From this point, it has been considered that it is necessary to use an amorphous material, a polycrystalline material, a single-crystal material or the like, which has been hitherto considered as the material which can achieve electronic conduction.

On the other hand, in recent years, it has been found that a liquid crystal material capable of providing a molecular orientation having a higher viscosity, compared to that of a general liquid material, can also exhibit the electronic conduction in the nematic phase, in the smectic phase, in the columnar phase thereof, or the like. It has also been found that such a liquid crystal material which can be used as the organic semiconductor material, and accordingly, applications of liquid crystal materials to organic electronic devices have also been studied.

The conduction of a low-molecular-weight non-liquid crystal organic compound in an isotropic phase (i.e., liquid phase) is considered to be an ion conduction, because its viscosity is generally low. An example in which electronic conduction in such a material is recognized, has been reported only in a extremely specific system. An example thereof is such that high-energy electrons are generated by the application of a high-energy electron beam, an X ray, or a short-wavelength light to a hydrocarbon, such as methane or ethane, and the conduction of the high-energy electrons is confirmed by using a time-of-flight method or the like (IEEE Transaction on Electrical Insulation vol. EI-19, No. 5, 390-418).

It is considered that the conduction of high-energy electrons, which have been generated in the above manner, is similar to the conduction of free electrons which are weakly bound to a molecule. Further, it has also been found that the mobility of the high-energy electron in the above-mentioned organic compound is much more than that in a general organic solid, and that some high-energy electrons show a mobility exceeding several tens $cm^2/Vs$. Among the liquid crystal substances, a phthalocyanine liquid crystal in an isotropic phase, which is one of discotic liquid crystals with a high viscosity, shows an electronic conduction, which has been confirmed by using the time-of-flight method (Extended Abstract of the 54th Meeting of The Japan Society of Applied Physics and Related Societies, 2007, p1333). However, at present, it is considered that the conduction in a rod-like non-polymeric liquid crystal substance or the conduction in a liquid phase (isotropic phase) of a non-liquid crystal substance is ionic conduction, and there has been no example wherein an electronic conduction of such a substance is experimentally confirmed. Accordingly, electronic conduction of such a substance has never been confirmed.

In general, it has been considered that the conduction of the so-called liquid (i.e., the liquid state in an isotropic phase) is ionic conduction. That is, it has been considered that the organic material in a liquid state cannot achieve any organic electronic device using electronic conduction. In other words, in the prior art, in order to achieve the function of the device using electronic conduction, the organic semiconductor material to be used for the organic electronic device is required to be an amorphous solid or crystal, or a liquid crystal phase of a liquid crystal material, the electronic conduction of which has already been confirmed, in a temperature range wherein the device can be driven.

PRIOR ART DOCUMENTS

Patent Documents

[Non-Patent Document 1] IEEE Transaction on Electrical Insulation vol. EI-19, No. 5 390-418
[Non-Patent Document 2] Extended Abstract of the 54th Meeting of The Japan Society of Applied Physics and Related Societies, 2007, p1333

SUMMARY OF INVENTION

Problems to be Solved by the Invention

An object of the present invention is to provide a new type organic semiconductor material which can solve the above problem encountered in the prior art.

Another object of the present invention is to provide a new organic semiconductor material which can achieve an electronic device using a liquid.

Means for Solving the Problem

As a result of earnest study, the present inventors have found a material capable of showing an isotropic phase and a fluidity, which exhibits electron and/or hole conduction.

The organic semiconductor material according to the present invention has been accomplished based on the above discovery.

Effects of the Invention

As described above, the present invention provides an organic semiconductor material which shows a liquid state at a temperature whereat the semiconductor material is operable. The organic semiconductor material according to the present invention can be applied to various fields, to which a conventional organic semiconductor material can be applied. That is, for example, the organic semiconductor material according to the present invention is applicable to an optical sensor, an organic optical receptor, an organic EL diode, an organic transistor, an organic solar cell, an organic semiconductor memory, and the like, without particular limitation.

More specifically, the present invention can achieve the organic electronic device by using electronic conduction in a liquid state, which is difficult be utilized in the prior art. Accordingly, the present invention can achieve a new device structure, form, and function of the organic electronic device, which is free from the limitation of the solid-state device in the prior art. Further, the organic semiconductor material according to the present invention enables the application and selection of any of techniques in producing, manufacturing or fabrication processes, which is free from the limitation of those processes in the prior art. The organic semiconductor material according to the present invention is especially effective for a device requiring a large area. This is also effective in increasing the application range of the device, and in reducing the production costs of the devices.

Further, in view of the material according to the present invention, the present invention enables the selection of a material which is free from the limitation of the conventional concept of the organic semiconductor material. Accordingly, the present invention can increase the range of selection of the material, which is suitable for various properties to be required for the device.

BRIEF DESCRIPTION OF DRAWINGS

FIG. 10 is a graph showing one example of the results obtained by measuring the transient photocurrent by the addition of toluene to polystyrene in Example 8.

MODES FOR CARRYING OUT THE INVENTION

Figure 1:
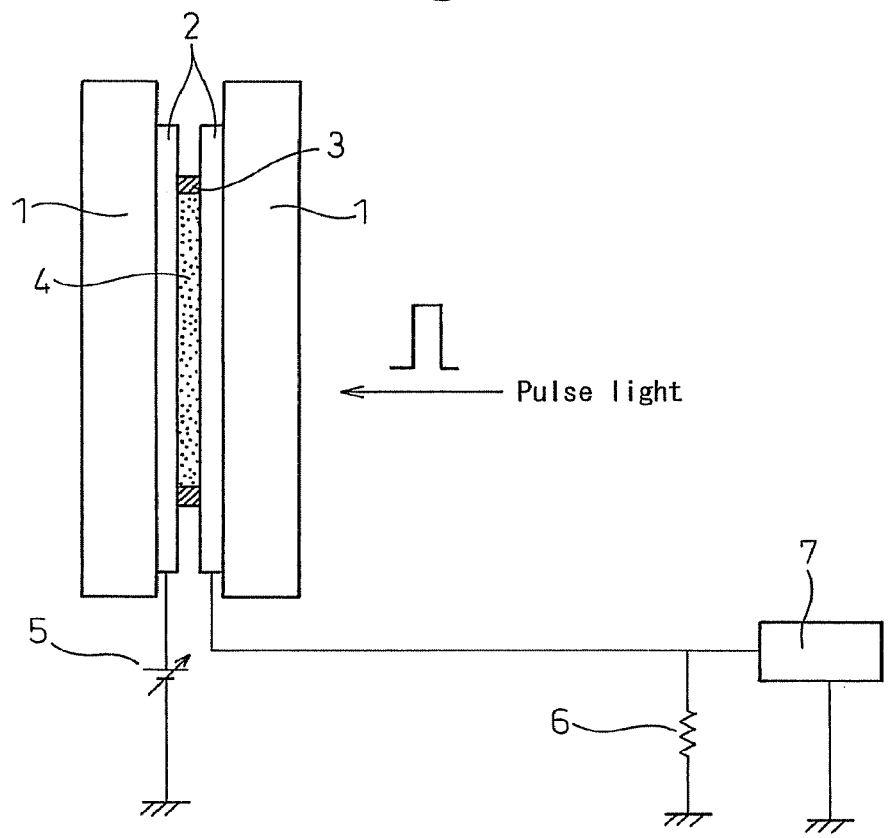
FIG. 1 is a schematic sectional view showing the structure of a time-of-flight measuring device which is usable in the present invention.

Hereinbelow, the present invention will be specifically described with reference to the accompanying drawings, as desired. In the following description, the "part" and "%" representing the amounts and ratios are based on the mass, unless otherwise noted specifically (it should be noted that a "mol %", for example, is clearly expressed in other cases).

(Mechanism of Present Invention)

According to the knowledge and investigations by the present inventors, the mechanism of electron and/or hole conduction in the organic semiconductor material according to the present invention may be presumed in the following manner.

The present inventors have made it clear that the ionic conduction, which is often observed in liquid crystal substances, can be induced not only by an ionic substance which is contained as an impurity in the liquid crystal substance, but also by the ionization of impurity molecules capable of providing an electrically trap level. The impurity molecule has its LUMO or HOMO level which are positioned between the HOMO level and LUMO level of a substance serving as a base for the liquid crystal substance. Based on these discoveries, the present inventors have also found that, even in the case of a "general organic substance" in a liquid state (i.e., liquid in an isotropic phase), the electric conduction of which is considered to be ionic conduction, a conduction mechanism satisfying a condition appearing hereinafter can be confirmed, and that such an organic substance can be used as an organic semiconductor, because of the electronic conduction in the organic substance.

Basically, the present invention may have three aspects. These aspects may include the selection of a material, purification of the material, and confirmation of the conduction mechanism in the material.

(Selection of Material)

In the case of the selection of a substance, it is necessary to choose an energy level associated with the transport of charges in the material in view of the function of a device, the operating condition of the device, the selection of an electrode material therefor, the environment for the device to be used, and the like.

Accordingly, as the material to be used for a semiconductor according to the present invention, it is necessary to use an organic substance having at least one aromatic conjugated π-electron system in the chemical structure of the organic substance.

(Preferred Organic Substance)

The "organic substance having at least one aromatic conjugated π-electron system" which is usable in the present invention is not specifically limited. In view of the optical characteristic, it is preferred to use a substance having an optical absorption peak (i.e., εMax), for example, in a wavelength range of 260 nm or more.

Further, in view of the chemical properties of the substance, the so-called aprotic substance may preferably be used. When the semiconductor material according to the present invention is a mixture, in general, each of the components constituting the mixture may preferably be aprotic. In the present invention, the term "aprotic" substance refers to a substance which does not have any "hydrogen atom" in its chemical structural formula such that the hydrogen atom would produce a hydrogen gas by the reaction of the substance with a metal Na. More actually, the term "aromatic" substance in the present invention refers to a substance which does give the stoichiometric production of hydrogen gas even in the case of the reaction thereof with metal Na in a "dried state" at a lower limit temperature in the operable temperature range for the semiconductor substance. It should be noted that, in the present invention, ethanol, for example, is not "aprotic".

(Mixture)

In the present invention, the organic semiconductor material may be a single material (for example, a compound), or may be in the form of a "mixture". The form of the mixture is not specifically limited, but may be preferably be homogeneous or uniform such that the mixture does not cause a phase separation at the lower limit temperature in the operable temperature range for the semiconductor material. The mixture can also be in the form of, for example, a solution or gel.

Solution

In an embodiment wherein the organic semiconductor material in the form of a "solution", it is possible to use the following solutes and solvents.

(Solute)

The solute is not specifically limited, as long as the solute is an organic material having semiconductor properties. For example, it is possible to use any of various materials which have hitherto been used as an organic semiconductor (i.e., so-called "OPC") photoconductive material, for example, in the field of electrophotography. Such organic semiconductors can be those disclosed, for example, in the following document (with respect to the details of the organic semiconductor, documents such as Paul M. Borsenberger & David S. Weiss "Organic Photorecepters for Xerography", Marcel Dekker Inc., New York, Basel, Hongkong, ISBN 0-8247-0173-9, 1998 may be referred to, as desired).

(Solvent)

In combination with the solute as described above, the solvent to be used providing the organic semiconductor material according to the present invention is not specifically limited. It is preferred to use an "aprotic" solvent, for example, as the above "solvent". In the present invention, the term "aprotic" substance refers to a substance which does not have any "hydrogen atom" in its chemical structural formula such that the hydrogen atom would produce a hydrogen gas by the reaction of the substance with a metal Na. More actually, the term "aromatic" substance in the present invention refers to a substance which does give the stoichiometric production of hydrogen gas even in the case of the reaction thereof with metal Na in a "dried state" at a lower limit temperature in the operable temperature range for the semiconductor substance. It should be noted that, in the present invention, ethanol, for example, is not "aprotic".

(Confirmation of Semiconductor Properties)

The properties of the "semiconductor" in the organic semiconductor material according to the present invention can be confirmed by observing the conduction (electronic conduction) due to at least one of hole and electron by use of a time-of-flight method.

(Operable Temperature Range)

In the present invention, the operable temperature range is not specifically limited. In view of the use of the organic semiconductor material according to the present invention in an ordinary and normal environment, the "operable temperature range" may be preferably in a range of about −60 to +300° C., and more preferably in a range of about −200 to +200° C., particularly preferably about −20 to +120° C.).

(Isotropic Phase)

The fact that the organic semiconductor material according to the present invention is in an "isotropic phase" can be confirmed by using the following method.

In general, when a texture of an isotropic phase, i.e., a liquid which does not exhibit an orientation, is observed with a polarized optical microscope, light does not pass through it so as to provide a "black" field of view in the microscope, because the liquid does not exhibit polarization properties in a cross-Nicol arrangement. In the actual observation, a sample is sandwiched between a slide glass and a cover glass or injected into a liquid crystal cell in capillary action, and then heated, as desired. In this way, the organic semiconductor in the "isotropic phase" may be confirmed by observing the liquid state of the sample with the polarized optical microscope so as to confirm the blocking of the transmission of light in a cross-Nicol arrangement, i.e., to confirm the black visual field.

(Electron and/or Hole Conduction)

The fact that the organic semiconductor material according to the present invention exhibits the "electron and/or hole conduction" can be confirmed, for example, by measuring the mobility by using a "dilution method" to be described later.

(Suitable Mobility)

The "mobility" of the organic semiconductor material according to the present invention may preferably be $10^{-7}$ $cm^2/Vs$ or more, more preferably $10^{-6}$ $cm^2/Vs$ or more, and particularly preferably $10^{-5}$ $cm^2/Vs$ or more (especially, $10^{-4}$ $cm^2/Vs$).

(Fluidity)

The fact that the organic semiconductor material according to the present invention has a "fluidity" can be confirmed by using the following method. In the present invention, the term "fluidity" as used herein is not necessarily complete fluidity, but the organic semiconductor material according to the present invention may also be a sludgy material such as coal tar.

Accordingly, the term "fluidity" as used in the present invention refers to a state satisfying any one of the following condition.

(a) The organic semiconductor material does not have shape-retaining properties.

(b) A material to be tested (for example, a material, the appearance of which is temporarily viewed so as to have shape-retaining properties) is molded into a rectangular parallelepiped shape with a base of 1×1 cm (w×d) and a height (h) of 10 cm, and is left standing for one week under normal temperature and normal pressure. In this case, when the material to be tested has a height of 9 cm or less (that is, the ratio of the height at this time with respect to the original height is 0.9 or less), the presence of "fluidity" (that is, the fact that the organic semiconductor material does not substantially have shape-retaining properties) is confirmed. The fluidity is measured at the lower limit temperature in the operable temperature range.

(Shape-Retaining Properties)

Accordingly, the organic semiconductor material according to the present invention can be distinguished from a "merely solid", because the semiconductor material does not substantially have shape-retaining properties in the operable temperature range.

(Purification of Material so as to Provide Higher Purity)

In order to purify a material so as to provide a higher purity, it is essential not only to reduce an ionic impurity but also to reduce impurity molecules that electrically form a trap level in the material. That is, in general, it is essential to reduce a substance (impurity molecules) having its LUMO level between the HOMO level and the LUMO level of a base material in a case where the transport of electrons is intended, or having its HOMO level between the HOMO level and the LUMO level of a base material in a case where the transport of holes is intended. In general, it is necessary to reduce the concentration of the impurity molecules to 100 ppm or less. Even by use of normal instrumental analysis, in many cases, it is difficult to determine the structure of the impurity molecules, and even the detection thereof.

The purpose of application of the impurity is to provide the application of the organic semiconductor in the present invention, as clearly described above, the undesired impurity should clearly be an ionic impurity and a substance which electrically provides a trap level with respect to the organic semiconductor material. In other words, when an impurity is a substance which does not electrically provide the trap level with respect to the organic semiconductor material, such an impurity can serve only as a diluent therefor, and accordingly the basic properties of the organic semiconductor are not impaired substantially. That is, when the organic material according to the present invention is used as an organic semiconductor, the chemical purity of the material does not become problematic, but the electrical purity of the material becomes important, because the mixing of the "electrically active impurity" will impair the function of the organic semiconductor. According to the studies performed by the present inventors, it is considered that the concentration of the electrically active impurity should be reduced to 100 ppm or less. This is because, when the concentration of such an impurity is high, the electronic conduction disappears so as to induce the ionic conduction due to the ionization of the impurity.

For the purpose of purifying the intended material, it is possible to use conventional purifying methods for organic chemicals, such as distillation, recrystallization, sublimation, various types of chromatography, zone melting, vapor crystal growth, and the like. It is particularly preferred to use a combination of these methods.

As to the degree of the purification, the chemical purity may preferably be as high as possible. However, as described above, in view of the use of an organic substance as semiconductor, the chemical purity itself is not important, but the concentration of the electrically active impurity is very important. Accordingly, as will be described later, the purification of the electrically active impurity needs to be determined according to a method of evaluating the impurity appearing hereinafter.

(Evaluation of Electrically Active Impurity)

Now, there will be described a method of evaluating the electrically active impurity in an organic liquid, which is another important aspect concerning the present invention.

In general, the ionic conduction may be a conduction in which ionized molecules or atoms (i.e., ions) are moved in a medium. As a result, the mobility thereof depends on both the ionic radius and the viscosity of the medium. The larger the ionic radius, the lower the mobility. The higher the viscosity, the lower the mobility. The above relationship is known as the Walden rule. The mobility in ionic conduction in an ordinary organic liquid is $10^{-5}$ cm$^2$/Vs or less.

(Electronic Conduction of Non-crystalline Substance)

The electronic conduction in non-crystalline organic substances is hopping conduction in which charges moves from a molecular to another molecular. The mobility may be governed by the distance between molecules which provide sites for the hopping, or the difference in the energy level between these sites. For an ordinary pure substance, its mobility is $10^{-4}$ cm$^2$/Vs or more in many cases. In the case of a substance having a structure providing a large dipole, or a substance containing a small amount of an impurity providing a shallow trap level, the mobility is often $10^{-5}$ cm$^2$/Vs or less in some cases. Accordingly, when the absolute value of the mobility is $10^{-4}$ cm$^2$/Vs or less, it is generally difficult to determine the conduction mechanism from the value thereof. Both electronic conduction and ionic conduction may be co-existent depending on the concentration of the impurity to be contained in the substance. In any case, the difference in conduction mechanism is essentially confirmed by using a transient photocurrent measurement by means of time-of-flight method and/or a method of determining the mechanism described hereinafter.

(Discrimination Between Electronic Conduction and Ionic Conduction)

One effective method for discriminating the electronic conduction of an organic liquid from the ionic conduction thereof involves determination from the mobility and the dependence thereof on electric field and temperature. When the temperature for measuring the mobility is 200° C. or lower, the conduction with a mobility of $10^{-3}$ cm$^2$/Vs or more is highly possibly electronic conduction. The conduction with a mobility of the order of $10^{-4}$ cm$^2$/Vs is highly possibly electronic conduction, but the confirmation thereof is necessary.

In the conduction in the liquid phase (isotropic phase) due to electronic, the mobility may generally depend on the electric field in many cases, whereas in ionic conduction, the mobility may not generally depend on the electric field. The activation energy in ionic conduction may be generally governed by the temperature dependence of the viscosity, which differs from the activation energy in electronic conduction. By use of these phenomena, the comparison between the temperature dependence of the viscosity and the temperature dependence of the mobility serves as a reference for the determination of the conduction. The difference in this characteristic, however, serves only as a guide, and does not provide a strict confirmation method.

(Addition of Diluent)

A simple method for surely determining whether the conduction mechanism is electronic conduction or ionic conduction comprises: adding a substance (diluent) not serving as an electronic trap, and confirming the resultant change in mobility between before and after the dilution.

When the substance of interest is diluted with a diluent with a lower viscosity than that of the substance of interest, the viscosity of the substance after the dilution is decreased, and at the same time the intermolecular distance therein is increased by the dilution. In this case, when the conduction observed before the dilution is electronic conduction, the mobility is decreased. On the other hand, when the conduction observed before the dilution is the ionic conduction, the mobility after the dilution is increased due to the decrease in viscosity.

In some cases, depending on the concentration of an impurity serving as the trap, a plurality of signals representing the coexistence of electronic conduction and ionic conduction can be observed. In this case, when the sample of interest is subjected to a dilution test as described hereinabove, a decrease in mobility is observed in the case of electronic conduction, while an increase in mobility is observed in the case of ionic conduction. The degree of the decrease or increase in the mobility depends on the concentration of the diluent, and on the degree of the difference in viscosity between the diluent and the substance of interest. Accordingly, the selection of the diluent does not necessarily cause a noticeable change in mobility of one of the substances. In such a case, it is possible to easily determine the type of conduction mechanism, by selecting the diluent while taking the viscosity thereof into consideration, or the concentration of the diluent is changed so as to systematically measure a change in mobility of the substance.

On the other hand, when the substance of interest has a low viscosity, and the diluent having a low viscosity is limited, and the viscosity of the substance after the dilution is not considerably different from that before the dilution. In this case, a substance having a higher viscosity is further used as another diluent, so as to confirm the conduction mechanism. In such a case, the mobilities in electronic conduction and in ionic conduction will be decreased by the dilution at the same time. Even the addition of a polymeric substance in a small amount, for example, 10 mol % or less, can largely increase the viscosity, and thus is very effective. Such an addition of the diluent may change the viscosity of the substance largely, as compared to a change in average intermolecular distance at the time of the addition of a diluent, whereby the difference between the conduction mechanisms can easily be determined.

Based on the above method and principle, the conduction in the liquid phase of the substance of interest is evaluated by using the time-of-flight method to determine whether the conduction is electronic conduction or ionic conduction. Accordingly, it can be determined whether or not the substance is usable for an organic semiconductor.

(Concentration of Impurity Serving as Trap)

In general, when the degree of the purification of the substance of interest is increased, the concentration of the impurity serving as the trap may gradually be decreased. When the concentration of the impurity is high, only a signal based on ionic conduction is observed in terms of the waveform of the transient photocurrent observed by the time-of-flight method. However, after the degree of the purification is increased, a signal representing electronic conduction starts to appear. As a result, the signal caused by ionic conduction and the signal caused by electronic conduction can simultaneously be observed. When the signals based on the two conductions of electronic conduction and ionic conduction are observed in terms of the waveform of the transient photocurrent, the contributions of electronic conduction and ionic conduction to the total conduction can be evaluated in the following way. That is, the contribution can be evaluated by a method wherein the waveforms of the transient photocurrent to electronic conduction and ionic conduction are separated from each other and assigned to the respective conductions, and the amounts of charges are determined from the time integral values of the current in these conductions (with respect to the details of such a measuring method, as desired, the documents: Chemical Physics Letters 397, 2004, 319-323; Japanese Journal of Applied Physics Vol. 44, No. 6A, 2005, pp. 3764-3768; J. Phys. Chem. B 2005, 109, 22120-22125; Physical Review B 72, 193203, 2005; and Journal of Applied Physics, 102, 2007, 093718 may be referred to). When the degree of the purification is increased, finally, the signal based on ionic conduction disappears, and only the signal representing electronic conduction is observed.

(One Example of Method of Measuring Mobility)

Now, a "method of measuring mobility" which is usable in the present invention will be described below.

In general, the mobility of a substance can be determined by measuring the hole effect thereof, measuring the transient photocurrent by use of the time-of-flight method, analyzing the characteristic of a device such as transistor, and the like. However, most of the organic semiconductor materials according to the present invention have a small conductivity which is similar to that exhibited by an insulator, have a very small carrier concentration, so that most of the organic semiconductor materials hardly show an ohmic contact with an electrode. Accordingly, in order to measure the mobility of a bulk material, the measurement of the transient photocurrent by the time-of-flight method is the most effective measure to be used therefor.

(Mobility in Electronic Conduction)

In general the mobility of a pure substance in electronic conduction may be larger than that in ionic conduction which involves the movement of an ionized substance. Accordingly, when such a behavior is observed in the waveform of the transient photocurrent due to the purification of the material, the signal appearing in a region at an shorter transit time due to the purification can be assigned to that due to electronic conduction, whereas the signal in a region at a longer transit time can be assigned to the ionic conduction caused by an impurity.

When the conduction mechanism is determined by using the above method, a substance having a small viscosity tends to show a larger mobility due to the ionic conduction, and in such a case, it is often difficult to distinguish the mobility in ionic conduction from that in electronic conduction. Accordingly, in a case where the substance has already been purified sufficiently as to show a high purity, and only a signal caused by one kind of conduction is observed from the beginning in the waveform of the transient photocurrent obtained by the time-of-flight method, it is necessary to totally determine the conduction mechanism from the absolute value of mobility thereof, the temperature and electric field dependence thereof, and the change in mobility thereof caused by a diluent. In this case, a method of evaluating a change in mobility due to the addition of a diluent is very effective. Particularly, it is very effective to examine the behavior of the mobility in the substance of interest before and after the dilution, by adding a substance having a larger viscosity and by adding a substance having a small viscosity as compared to the viscosity of the substance of interest.

In order to determine the conduction mechanism of the substance of interest, it is basically possible to determine the conduction mechanism by using the method as described hereinabove, wherein the degree of the purification is increased, and the waveform of the transient photocurrent is measured by using the time-of-flight method. However, in some cases, the determination of the conduction mechanism becomes difficult exceptionally, even by use of the evaluation involving the addition of a diluent as described above. In this case, it is possible to determine the conduction mechanism of a substance before the addition of an impurity thereto, by selecting the impurity serving as a trap with reference to the HOMO and LUMO levels of the substance of interest, measuring the transient photocurrent of a sample of the substance, to which the impurity has been added, by using the time-of-flight method, and observing the ionic conduction due to the added impurity. In this case, with respect to the substance to be added as the impurity, it is important to select a substance so as to give a not so large difference in ionic radius between the impurity and the substance of interest. Further, it is also important to use the impurity in a concentration, such as about 0.01 to 1 mol %, so that the impurity in the low concentration may not serve as a diluent. It is important to select an impurity so as to provide a small change in viscosity of the substance of interest before and after the addition of the impurity. The measurement under such a condition can provide the value of the ionic conduction in the substances of interest, even with a difference in ionic radius, if any. Accordingly, such a method is very useful for the determination of the conduction mechanism.

For example, in such a case, it is possible to observe only one signal due to one conduction mechanism in the waveform of the transient photocurrent of the substance of interest. In a case where another signal due to a new conduction appears in a region at a later time in the waveform of the transient photocurrent after the above addition of the impurity, the value of the mobility can be determined while taking the difference in ionic radius into consideration, so as to determine whether the conduction mechanism in the substance of interest before the addition of the impurity is electronic conduction or ionic conduction.

An organic substance in a liquid phase (isotropic phase), having reduced impurity and having been confirmed to show electronic conduction, is usable as an organic semiconductor. When the thus obtained organic substance is used, the organic substance is also usable after dilution thereof with a diluent as described above. In particular, when the organic semiconductor substance is diluted with a polymer substance, an addition of the polymer substance in a small amount does not lead to a large decrease in mobility, but can increase the viscosity of the substance. The addition is very effective for the applications, and has the effect of suppressing the ionic conduction.

In the present invention, the impurity causing ionic conduction in an organic substance is reduced to suppress ionic conduction, so that the inherent electronic conduction can be basically achieved. For this reason, in order to reduce the impurity causing ionic conduction, it is apparently important to perform purification of the substance and it is essential to confirm that the conduction mechanism of the purified substance is not ionic conduction, but electronic conduction. The confirmation can be performed by measurement of the transient photocurrent by the time-of-flight method. Alternatively, the confirmation can be performed by measuring a change in transit time of charges by addition of a diluent that increases or can increase the viscosity of the substance as compared to the viscosity of pure substance. Alternatively, the confirmation can be performed by comparison with the ionic conduction in the organic substance doped with a very small amount of a substance electrically providing a trap level. Otherwise, the confirmation can be performed by a combination of the above methods.

EXAMPLES

The present invention will be described in detail below by way of Examples, and is not limited thereto.

Measurement Example 1

Now, the present invention will be described below by showing cautions about the measurement of transient photocurrent by the time-of-flight method for distinguishing electronic conduction from ionic conduction, the structure of a sample used for the measurement, and the waveform of the transient photocurrent actually observed.

The time-of-flight method used for evaluation in the present invention involves applying an electric field to a sample for measurement to generate charges eccentrically located near an electrode, and measuring a displacement current as a function of time by using an oscilloscope or the like when the charges reach an opposite electrode. Suppose that charges moves at a certain velocity toward the opposite electrode, the electric field across the sample can be set uniform, and the transit distance of charges can be set to the thickness of the sample. In this case, a time required for charges to reach the opposite electrode, which is, a transit time of charges is estimated from the current waveform, so that the mobility of the sample can be determined from the thickness of the sample, the strength of the electric field, and the transit time of the charge.

In order to ensure the measurement of the mobility based on the above principle, the measurement performs the following method of generating charges eccentrically located near the electrode. That is, the generating method involves applying a pulse light with a short time width of one tenth or less of the transit time of a charge using as an excitation light, a light having a large absorption coefficient and a depth of light penetration of one tenth or less of the thickness of the sample. It is essential to set not only the conditions for application of light used as the charge formation means (light wavelength, light intensity, light application time), but also the measurement conditions sufficiently taking into consideration the following factors. That is, the measurement conditions are set taking into consideration the thickness of a sample, the selection of an electrode for ensuring the blocking contact, the level of an external resistance used for measuring a current, a time constant of a measurement system, and the like.

FIG. 1 shows an example of a sample structure and a measurement system which are usable for the above measurement.

The exact thickness of a liquid crystal cell used for the measurement is important to determine the mobility. Accordingly, it is necessary to accurately determine the thickness of the liquid crystal cell by the measurement of an electric capacitance along with the measurement of an interference pattern by measuring the optical characteristic. The measurement is also effectively performed using the same cell. It is necessary to pay attention to the deformation of the cell when a high electric field is applied.

A cell is formed by fixing two glass or crystal substrates with electrodes via a spacer in a certain thickness, and a liquid is charged as a sample into the cell. The cell is used for the measurement. At this time, attention should be paid to the fact that an impurity would be dissolved from a component used for producing the spacer or the cell into the sample. Taking into consideration the depth of light penetration with the wavelength of an irradiation light into the sample, the cell may be generally used whose thickness is about ten times as large as that of the sample. The electrode of the sample cell is used to irradiate light, and is a semi-transparent metal electrode made by vapor deposition or sputtering, or a transparent electrode, such as ITO, such that its one side becomes semi-transparent. In this case, attention needs to be paid so as to form the blocking contact which can suppress the injection of charges from the electrode into the sample. It is apparent that the measurement of the transient photocurrent selects the measurement conditions according to the measurement time region, taking into consideration an electric capacitance of the measurement cell, a resistance of the measurement sample, a resistance to be coupled, and a time constant of the measurement system.

A voltage is applied to the sample, and a pulse light is irradiated by using a nitrogen pulse laser or a harmonic or the like of a YAG laser to thereby photogenerate charges. In this case, it is necessary that the amount of charges produced by light irradiation is reduced within 10% or less of the amount of charges determined by both a geometric capacitance of the sample and an applied voltage to suppress the influence due to a space charge.

The light irradiation time has to be short enough to be ignorable as compared to the transit time of charges. As a light source, a pulse light (having a pulse width of several tens ns or less) of a nitrogen laser or a YAG laser, is usable.

Figure 2:
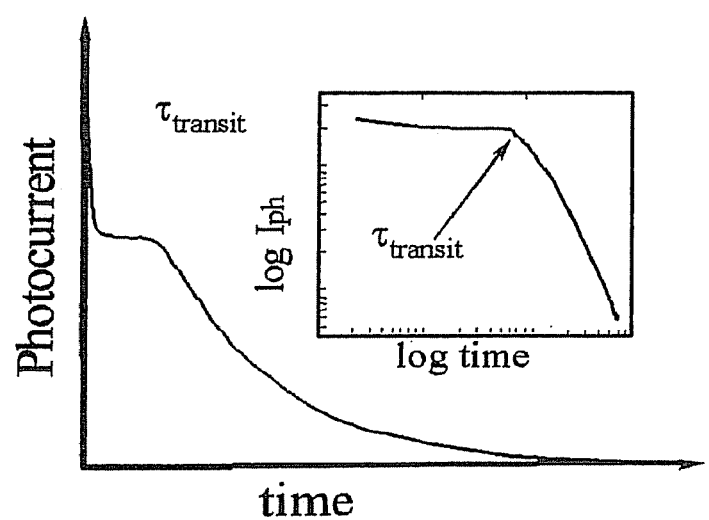
FIG. 2 is a schematic diagram of a waveform of a typical transient photocurrent which can be measured by using the above device shown in FIG. 1.

FIG. 1 is a diagram showing the structure of a time-of-flight measurement device. FIG. 2 is a schematic diagram of a waveform of a typical transient photocurrent measured. As to the typical waveform of the photocurrent measured by the time-of-flight method, the measurement waveform of an organic liquid may generally have a shoulder representing a transit time when plotted in a normal scale as shown on the left side of the figure.

In order to determine the transit time of charges, it is necessary to confirm the shoulder shown in FIG. 2 in the normal scale and the position of the shoulder systematically changing according to the intensity of the electric field.

In general, the waveform of the organic liquid having a high purity and measured by the time-of-flight method may be of the so-called non-dispersive type. When the photocurrent is plotted in the linear scale against the measurement time, a clear shoulder representing a transit time is observed. A mobility is determined from the following equation: $\mu=d^2/\tau V$ where $\tau$ is the transit time, $\mu$ is a mobility, d is the thickness of the sample, and V is a voltage. In this case, it needs to be confirmed that when the applied voltage is changed to change the moving velocity of charges, the transit time is changed together with the above change, and that the shoulder observed really represents the transit time. (Applications of Liquid Organic Semiconductor Material)

Organic semiconductor material may not be generally defined strictly, unlike inorganic semiconductor material, such as Si. An "organic material which can be used as an electronic device due to the function of the substance resulting from the flow of an electric current therethrough" is called as an organic semiconductor.

Most of the organic semiconductor materials have a low concentration of carriers thermally formed (holes and electrons), and thus are categorized as the insulator in view of conductivity. However, the carriers (holes and electrons) can be transported. By use of the generation of carriers by the irradiation of light, or the implantation of the carriers from an electrode, the carriers are introduced into the organic semiconductor. The function exhibited by the transport or recombination of the carriers is usable to manufacture various electronic devices, such as an optical sensor, an EL device, a transistor, or a solar cell. This does not depend on the form of materials, such as solid or liquid, as long as the electronic conduction is basically caused in the material.

Actually, many examples using a liquid crystal material having liquid properties for the optical sensor, the organic EL device, and the solar cell are reported. For example, Appl. Phys. Lett., 74, pp. 2584-2586 (1999), Appl. Phys. Lett., 73, pp. 1595-1597 (1998) have respectively reported examples in which the optical sensor and the organic EL device were produced. As an example using a non-liquid crystal liquid, Appl. Phys. Lett., 95, pp053304 (2009) reports an example of manufacturing the organic EL device.

According to a method disclosed in the present specification, the properties of a liquid material as an organic semiconductor can be ensured, so that various electronic devices can be manufactured using the liquid organic semiconductor based on the example described above.

Example 1

(A material having a mobility of $10^{-3}$ $cm^2/Vs$ or more. It is not necessary to doubt whether this material causes ionic conduction.)

A purified TPD (N,N'-diphenyl-N,N'-bis(3-methylphenyl)-[1,1'-diphenyl]-4,4'-diamine) was injected into a liquid crystal cell at an isotropic phase temperature. The transient photocurrent was measured by the above time-of-flight method to determine a mobility in the material from the transit time of charges. The mobilities of positive charges and negative charges obtained at a measurement temperature of 150° C. were $4\times10^{-3}$ $cm^2/Vs$ and $4\times10^{-3}$ $cm^2/Vs$, respectively. From the mobilities, the conduction can be determined to be not ionic conduction, but electronic conduction by holes and electrons.

In the same manner, for a purified TTA (tritolylamine), the mobilities of positive charges and negative charges at 100° C. were determined to be $4\times10^{-3}$ $cm^2/Vs$ and $9\times10^{-5}$ $cm^2/Vs$, respectively. Accordingly, for at least positive charges, the conduction can be determined to be electronic conduction by holes.

Example 2

Figure 3:
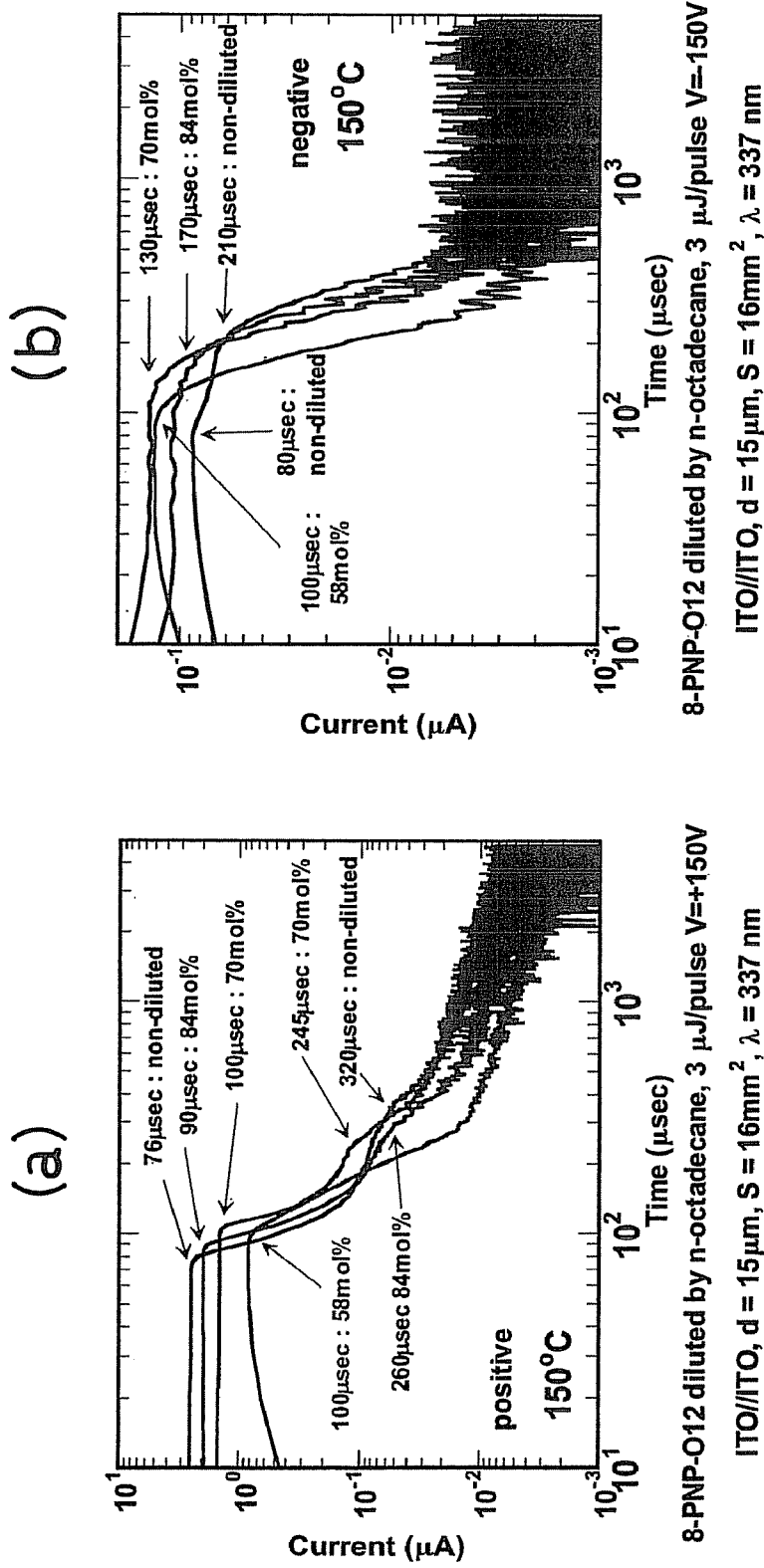
FIG. 3 is a graph showing the changes of waveforms of the transient photocurrent obtained in Example 2 appearing hereinafter.

A 6-(4'-octylphenyl)-2-dodecyloxynaphthalene (8-PNP-O12) in an isotropic phase (liquid phase: a sample thickness of 15 m) was injected into a glass cell having ITO electrodes (4 mm square) positioned therein. A 337 nm nitrogen laser pulsed light (pulse width: 600 ps, 3 μJ/pulse) was irradiated to the electrode on the light irradiation side, and the transient photocurrent observed during the application of +150 V or −150 V was measured by a digital oscilloscope. The waveforms of the non-diluted 8-PNP-O12 shown in FIG. 3 had two shoulders corresponding to the transit times in different time regions (FIG. 3A shows the transient photocurrent waveform of positive charges, and FIG. 3B shows the transient photocurrent waveform of negative charges). In order to clarify the conduction, a dilution experiment using n-octadecane was performed. FIGS. 3A and 3B also show the waveforms of the transient photocurrent for samples having n-octadecane concentrations of 84 mol %, 70 mol %, and 58 mol %.

Figure 4:
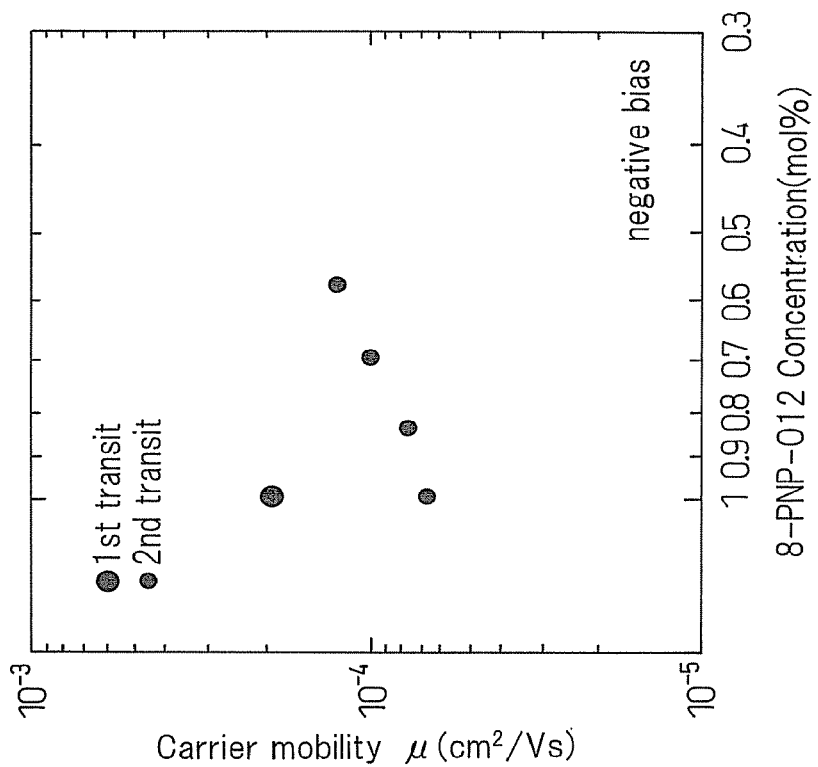
FIG. 4 is a graph which has been obtained by plotting the mobilities calculated from the "two transit times" (shoulder portions) in Example 2, against the concentration of n-octadecane.
Figure 4:
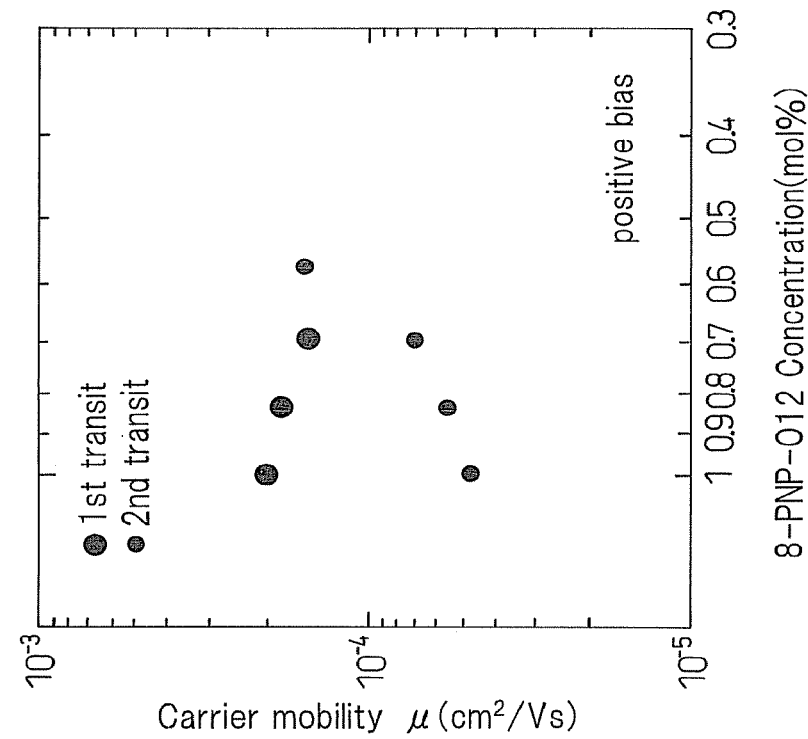

Among two shoulders observed in each transient photocurrent waveform of the positive and negative charges, the shoulder in the short or early time region is shifted toward the later time region with increasing the concentration of n-octadecane, and another shoulder in the later time region is shifted toward the earlier time region with increasing the concentration of n-octadecane. From this aspect, the shoulder in the earlier time region can be attributed to electronic conduction, and another shoulder in the later time region can be attributed to ionic conduction. FIG. 4 shows the mobilities determined from two transit times plotted versus the concentration of n-octadecane. In the two series of changes in mobility of 8-PNP-O12 by dilution (FIG. 4A: positive charges, FIG. 4B: negative charges), the "1st transit" represents the mobilities determined from the transit times of the faster charges, and the "2nd transit" represents the mobilities determined from the transit times of the slower charges. In the "1st transit", the higher the dilution level, the lower the mobility in electronic conduction. In contrast, in the "2nd transit", the higher the dilution level, the higher the mobility in ionic conduction.

From the result, the mobilities of holes and electrons at 130° C. were determined to be $1.1\times10^{-4}$ $cm^2/Vs$, and $1.1\times10^{-4}$ $cm^2/Vs$, respectively. The mobilities of positive ions and negative ions were determined to be $2.7\times10^{-5}$ $cm^2/Vs$, and $4.6\times10^{-5}$ $cm^2/Vs$, respectively.

Example 3

Figure 5:
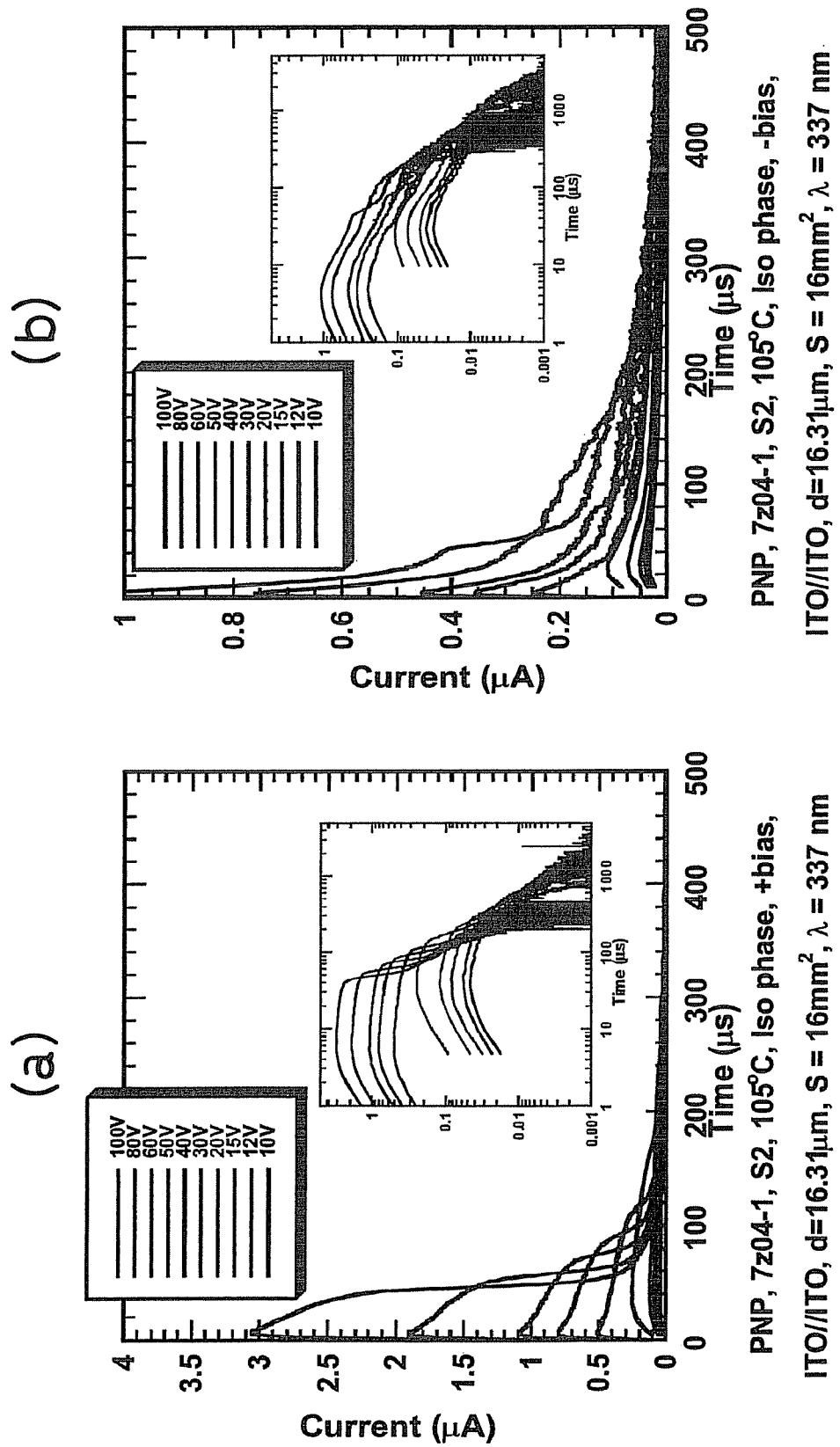
FIG. 5 is a graph showing another example of "two shoulder portions" corresponding to the two different transit times obtained in Example 3.

In the same manner as in Example 2, 2-phenylnaphthalene in an isotropic phase (liquid phase: a sample thickness of 16.31 μm) was charged into a glass cell having ITO electrodes (4 mm square) positioned therein. A 337 nm nitrogen laser pulsed light (pulse width: 600 ps, 3 μJ/pulse) was irradiated at 105° C. to the electrode on the light irradiation side, and the transient photocurrents observed during the application of +10 to 100 V or −10 to 100 V were measured by a digital oscilloscope. The waveforms of the transient photocurrents are shown in FIG. 5. The waveforms of the positive charges have one shoulder representing the transit of a faster charge. The waveforms of the negative charges have "two shoulders" corresponding to two different transit times.

In the same manner as in Example 2, from the result of the dilution experiment, the mobilities of holes and electrons were determined to be $8.9\times10^{-4}$ cm$^2$/Vs, and $8.8\times10^{-4}$ cm$^2$/Vs, respectively. The mobility of negative ions was determined to be $2.1\times10^{-5}$ cm$^2$/Vs.

Example 4

Figure 6:
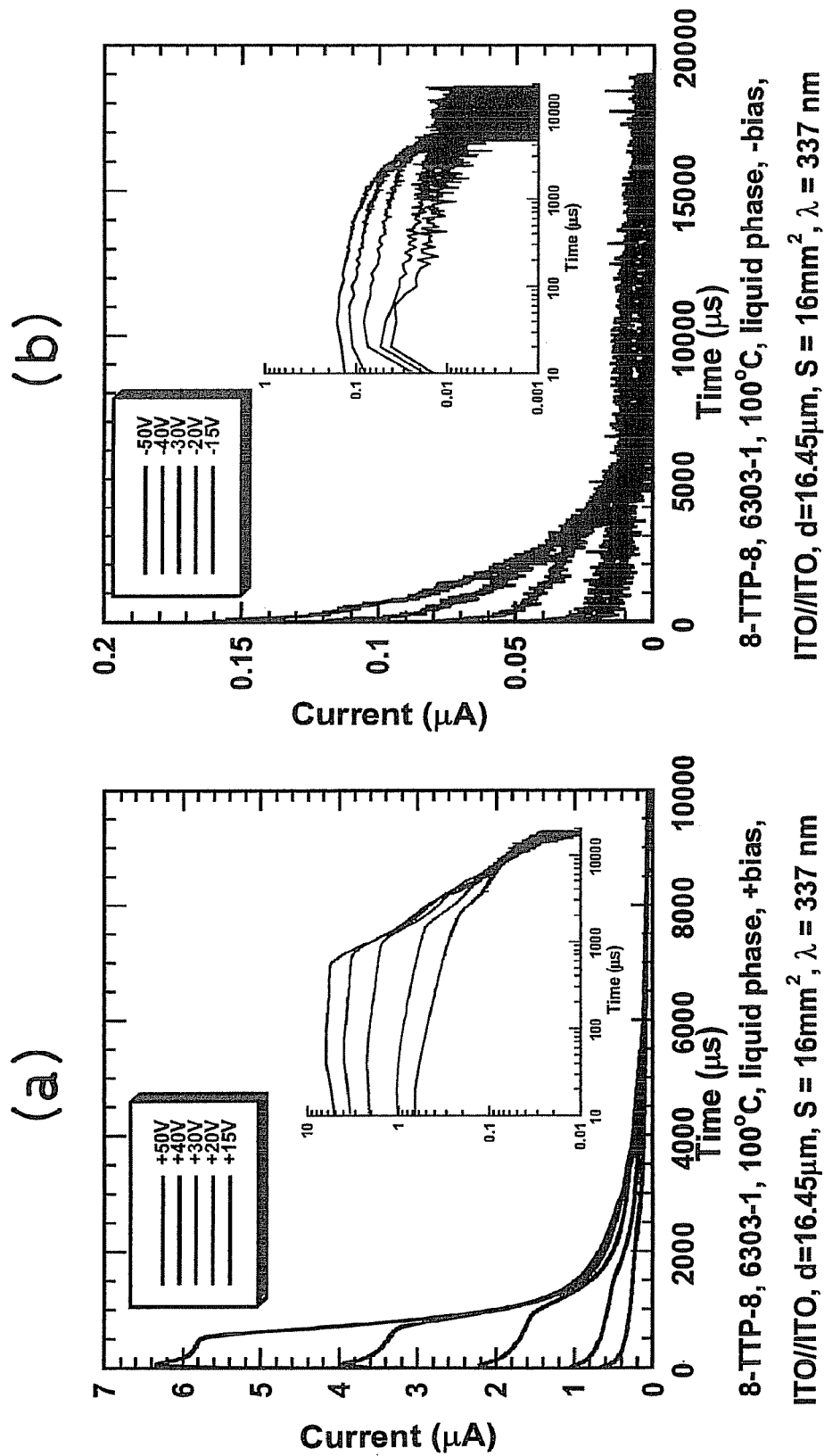
FIG. 6 is a graph showing one example of the waveforms of the transient photocurrent obtained in Example 4.

In the same manner as in Example 2, ω,ω'-dioctylterthiophene in an isotropic phase (liquid phase: a sample thickness of 16.45 μm) was charged into a glass cell having ITO electrodes (4 mm square) positioned therein. A 337 nm nitrogen laser pulsed light (pulse width: 600 ps, 3 μJ/pulse) was irradiated to the electrode on the light irradiation side at 100° C., and transient photocurrents observed during the application of +15 to 50 V or −15 to 50 V were measured by the digital oscilloscope to obtain the transient photocurrent waveforms as shown in FIG. 6. Each transient photocurrent waveform of the positive and negative charges has two shoulders corresponding to two different travelling times.

In the same manner as in Example 2, from the result of the dilution experiment, the mobilities of holes and electrons were determined to be $9.3\times10^{-5}$ cm$^2$/Vs, and the mobilities of positive ions and negative ions were determined to be $2.0\times10^{-5}$ cm$^2$/Vs and $2.9\times10^{-5}$ cm$^2$/Vs, respectively.

Example 5

Figure 7:
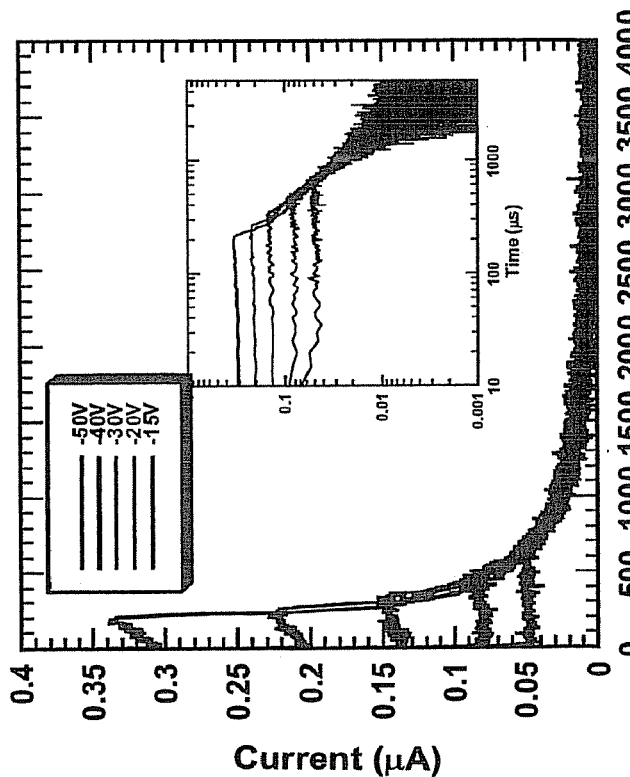
FIG. 7 is a graph showing one example of the waveform of the transient photocurrent obtained in Example 5.
Figure 7:
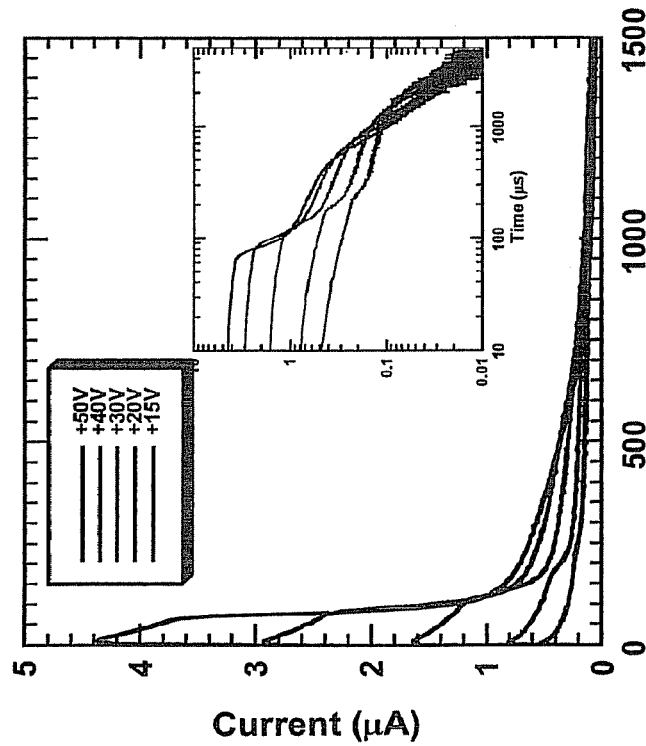

In the same manner as in Example 2, ω,ω'-dihexylcyquaterthiophene in an isotropic phase (liquid phase: a sample thickness of 13.86 μm) was charged into a glass cell having ITO electrodes (4 mm square) positioned therein. A 337 nm nitrogen laser pulsed light (pulse width: 600 ps) was irradiated to the electrode on the light irradiation side at 200° C., and the transient photocurrents observed during the application of +15 to 50 V or −15 to 50 V were measured by the digital oscilloscope to obtain the waveforms of the transient photocurrents as shown in FIG. 7. The waveforms of positive charges have two shoulders corresponding to two different transit times, and the waveforms of negative charge transit has one shoulder.

In the same manner as in Example 2, from the result of the dilution experiment (the absolute value), the mobilities of holes and electrons were determined to be $5.5\times10^{-4}$ cm$^2$/Vs, and $1.8\times10^{-4}$ cm$^2$/Vs, respectively, and the mobilities of positive and negative ions were determined to be $8.0\times10^{-5}$ cm$^2$/Vs and $8.4\times10^{-5}$ cm$^2$/Vs, respectively.

Example 6

Figure 8:
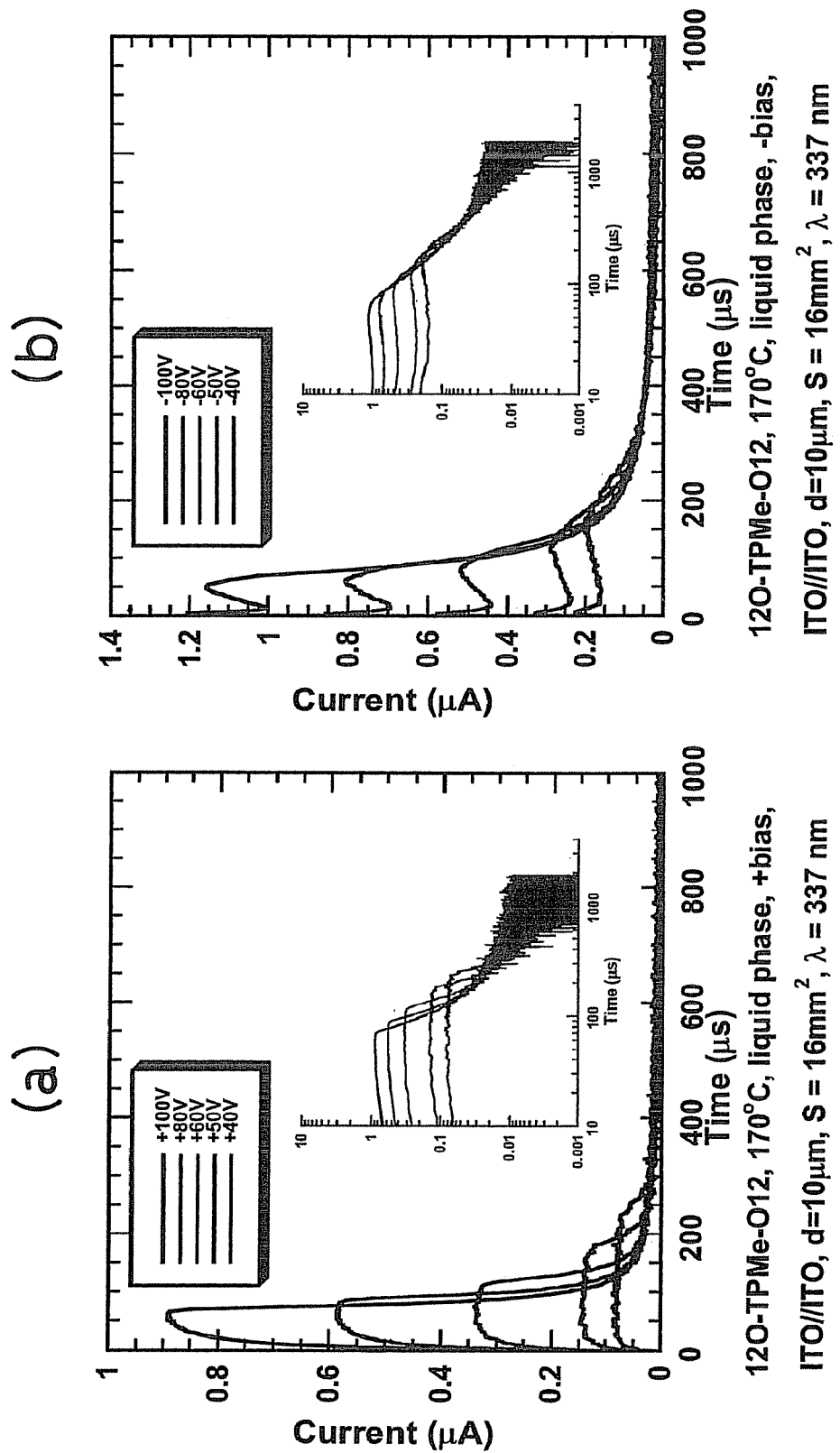
FIG. 8 is a graph showing one example of the waveform of the transient photocurrent obtained in Example 6.

In the same manner as in Example 2, ω,ω'-didodecyloxy-2-methylterphenyl (12O-TPMe-O12) in an isotropic phase (liquid phase: a sample thickness of 10 μm) was charged into a glass cell having ITO electrodes (4 mm square) positioned therein. A 337 nm nitrogen laser pulsed light (pulse width: 600 ps) was radiated irradiated to the electrode on the light irradiation side at 170° C., and the transient photocurrents observed during the application of +40 to 100 V or −40 to 100 V were measured by the digital oscilloscope to obtain the waveforms of the transient photocurrents as shown in FIG. 8. Each waveform of positive charges has one shoulder corresponding to one transit time.

In the same manner as in Example 2, from the result of the dilution experiment, the mobilities of holes and electrons were determined to be $9.7\times10^{-5}$ cm$^2$/Vs, and $1.0\times10^{-4}$ cm$^2$/Vs, respectively.

Example 7

Figure 9:
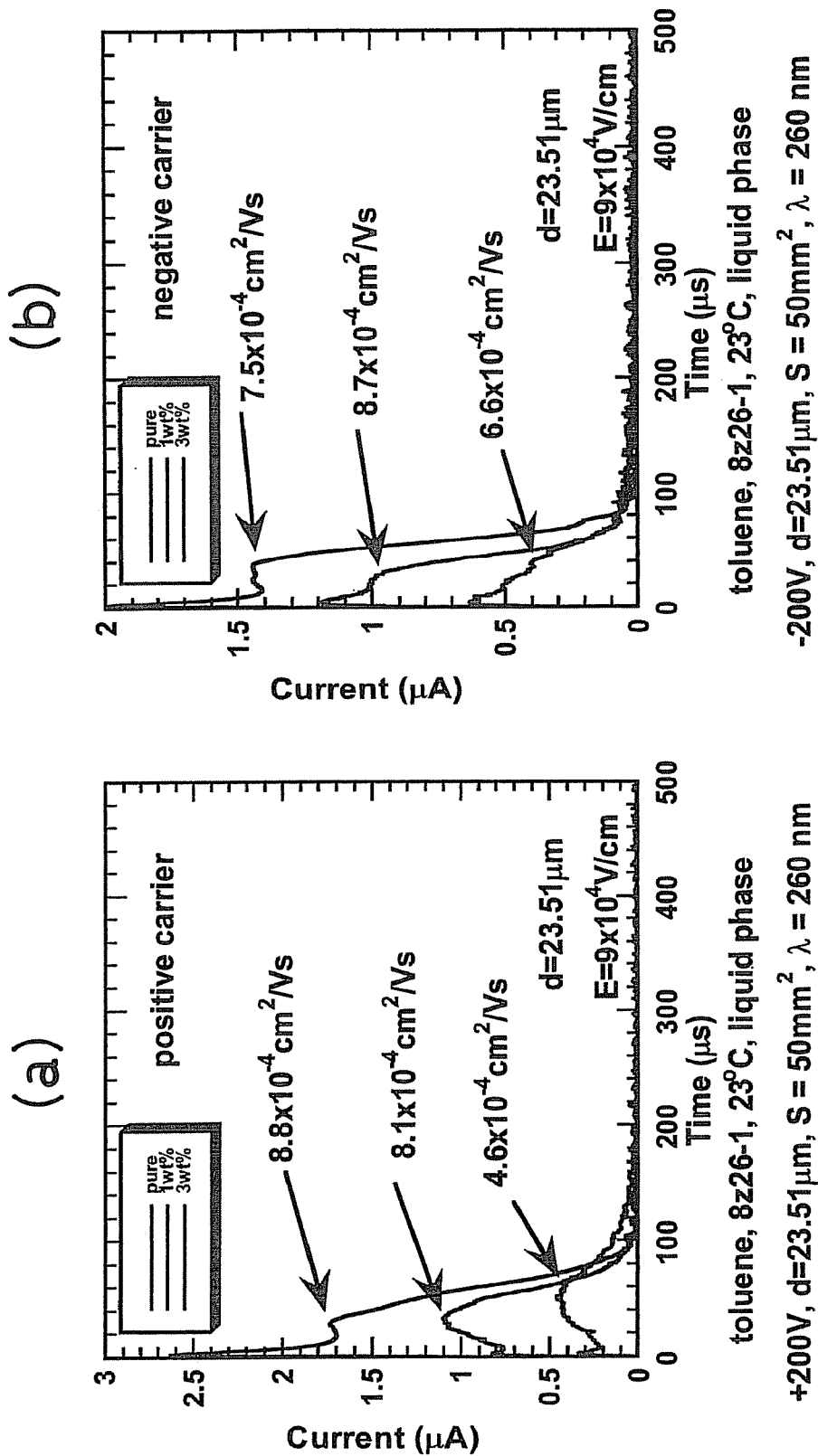
FIG. 9 is a graph showing one example of the results obtained by an experiment using a dilution with n-hexane in Example 7, which is similar to Example 2.

In the same manner as in Example 2, toluene was charged at room temperature into a crystal cell (liquid phase: a thickness of 23.51 μm) having an ITO electrode ITO electrodes (4 mm square) positioned therein. A 260 nm YAG laser pulsed light was irradiated to the electrode on the light irradiation side at 23° C., and the transient photocurrent observed during the application of +200 V or −200 V were measured by the digital oscilloscope to obtain the waveforms of the transient photocurrent as shown in FIG. 9. Each waveform of the positive and negative charges has a respective shoulder corresponding to the transit times. In the same manner as in Example 2, a dilution experiment using n-Hexane was performed. As a result, as shown in FIG. 9, a slight decrease in mobility was observed.

Example 8

A change in Example 7 was not clear. Accordingly, a styrene monomer sufficiently purified was thermally polymerized without any catalyst. In the same manner, the thus-obtained polystyrene was added to the toluene. The transient photocurrent of the material was measured to determine the mobility thereof as shown in FIG. 10.

According to the result, the toluene containing polystyrene has its viscosity increased largely, but its mobility does not change so much. Accordingly, the mobilities of holes and electrons in toluene were determined to be $8\times10^{-4}$ cm$^2$/Vs, and $8\times10^{-4}$ cm$^2$/Vs, respectively.

EXPLANATION OF LETTERS OR NUMERALS

1 Substrate
2 Electrode
3 Spacer
4 Sample
5 Power supply (having positive and negative polarities)
6 External resistor
7 Digital oscilloscope

The invention claimed is:

1. A method of evaluating, by steps a) to e), a concentration of electrically active impurities in an organic liquid, the method comprising:
   a) charging the organic liquid into a cell, wherein the cell comprises a first substrate with an electrode and a second substrate with an opposite electrode, the first substrate and the second substrate fixed with a spacer;
   b) applying an electric field to the organic liquid in an isotropic phase to generate charges eccentrically located near the electrode of the first substrate;
   c) measuring a displacement current, as a function of time, when the charges reach the opposite electrode;
   d) obtaining a mobility of the organic liquid in an isotropic phase from a transit time according to a time-offlight method, the transit time represented by two shoulders of the displacement current; and e) determining a conduction of the organic liquid in an isotropic phase to be both ionic conduction and electronic conduction, both ionic conduction and hole conduction, or all of ionic conduction, electronic conduction and hole conduction, wherein the organic liquid comprises an organic substance having at least one aromatic conjugated π-electron system in a chemical structure thereof.

2. The method of claim 1, wherein the organic substance is aprotic.

3. The method of claim 1, wherein the organic liquid is a mixture.

4. The method of claim 3, wherein the mixture is a solution.

5. The method of claim 4, wherein the solution comprises a solute and a solvent and the solvent is aprotic.

6. The method of claim 1, wherein the displacement current is a transient photocurrent.

7. The method of claim 1, wherein the determining comprises:

observing signals of both ionic conduction and electronic conduction, both ionic conduction and hole conduction, or all of ionic conduction, electronic conduction and hole conduction; and evaluating a contribution of the ionic conduction and the electronic conduction and/or the hole conduction to a total conduction by separating waveforms of the displacement current of the electronic conduction and the ionic conduction and determining amounts of the charges from a time integral value of a current.

8. The method of claim 7 comprising adding a substance with a lower viscosity than the organic liquid in an isotropic phase or a substance with a higher viscosity than the organic liquid in an isotropic phase, wherein the substance with the lower viscosity than the organic liquid in an isotropic phase or the substance with the higher viscosity than the organic liquid in an isotropic phase does not serve as an electronic trap.

9. The method of claim 8, wherein the substance with the higher viscosity than the organic liquid in an isotropic phase is a polymer substance.

10. A method of evaluating, by steps a) to f), a concentration of electrically active impurities in an organic liquid, the method comprising:

a) charging the organic liquid into a cell, wherein the cell comprises a first substrate with an electrode and a second substrate with an opposite electrode, the first substrate and the second substrate fixed with a spacer;

b) applying an electric field to the organic liquid in an isotropic phase to generate charges eccentrically located near the electrode of the first substrate;

c) measuring a displacement current, as a function of time, when the charges reach the opposite electrode;

d) obtaining a mobility of the organic liquid in an isotropic phase from a transit time according to a time-of-flight method, the transit time represented by one shoulder of the displacement current;

e) determining a conduction of the organic liquid in an isotropic phase to be ionic conduction only; and f) purifying the organic liquid until a signal caused by the ionic conduction and a signal caused by electronic conduction simultaneously are observed in an isotropic phase, wherein the organic liquid comprises an organic substance having at least one aromatic conjugated π-electron system in a chemical structure thereof.

11. The method of claim 10, wherein the concentration of the electrically active impurities in the organic liquid is 100 ppm or less after purifying the organic liquid.

12. A method of evaluating, by steps a) to f), a concentration of electrically active impurities in an organic liquid, the method comprising:

a) charging the organic liquid into a cell, wherein the cell comprises a first substrate with an electrode and a second substrate with an opposite electrode, the first substrate and the second substrate fixed with a spacer;

b) applying an electric field to the organic liquid in an isotropic phase to generate charges eccentrically located near the electrode of the first substrate;

c) measuring a displacement current, as a function of time, when the charges reach the opposite electrode;

d) obtaining a mobility of the organic liquid in an isotropic phase from a transit time according to a time-of-flight method, the transit time represented by two shoulders of the displacement current;

e) determining a conduction of the organic liquid in an isotropic phase to be both ionic conduction and electronic conduction, both ionic conduction and hole conduction, or all of ionic conduction, electronic conduction and hole conduction; and f) purifying the organic liquid until a signal based on the ionic conduction disappears and only a signal representing the electronic conduction is observed in an isotropic phase, wherein the organic liquid comprises an organic substance having at least one aromatic conjugated π-electron system in a chemical structure thereof.

13. The method of claim 12, wherein the concentration of the electrically active impurities in the organic liquid is 100 ppm or less after purifying the organic liquid.

* * * * *